United States Patent [19]

Corris

[11] Patent Number: 5,016,136
[45] Date of Patent: May 14, 1991

[54] CHARGE BUILD-UP AND DECAY MONITOR

[75] Inventor: C. James Corris, Shenandoah, Ga.

[73] Assignee: Semtronics Corporation, Peachtree City, Ga.

[21] Appl. No.: 312,609

[22] Filed: Feb. 17, 1989

[51] Int. Cl.$^5$ .............................................. H01T 23/00
[52] U.S. Cl. ...................................... 361/230; 361/220
[58] Field of Search ............... 361/212, 220, 230, 231, 361/233, 235; 324/457, 485, 678

[56] References Cited

U.S. PATENT DOCUMENTS

| | | | |
|---|---|---|---|
| 4,370,616 | 1/1983 | Williams | 324/458 |
| 4,553,099 | 11/1985 | Kasahara et al. | 324/458 |
| 4,743,837 | 5/1988 | Hedzog | 324/678 |

OTHER PUBLICATIONS

Electrostatic Analyzer Model EA 2 Product Information from the SIMPO Co., Inc. (Copyright 1987; Printed Date Feb. 16, 1988).

AIM 5000 Product Information from Voyager Technologies, Inc. (Copyright 1987).

*Primary Examiner*—A. D. Pellinen
*Assistant Examiner*—Jeffrey A. Gaffin
*Attorney, Agent, or Firm*—Kilpatrick & Cody

[57] ABSTRACT

A device for monitoring air ionization. The charge build-up and decay monitor uses two metal plates, a first "floating" plate electrically isolated from the monitoring circuitry and a second "sensing" plate, to form an air dielectric capacitor of known capacitance. In charge decay mode the floating plate is charged and a second capacitor is connected between the sensing plate and electrical ground, producing a capacitive voltage divider. In charge build-up mode the second capacitor is disconnected and a second air dielectric capacitor of known capacitance is formed between the sensing plate and the ground metal casing of the device, again producing a capacitive voltage divider. The monitoring circuitry measures the charge present on the sensing plate, which is proportional to the charge present on the floating plate, without using failure-prone chopper electrometers or other electromechanical means. Internal monitoring circuitry computes the absolute value of the charge present on the floating plate to avoid the need for parallel processing circuits for positive and negative charges, the accuracy of the measurements are enhanced by the use of a large-valued resistor as part of the monitoring circuit to slow greatly the discharge of the second capacitor. Additional accuracy is obtained by monitoring the decay time between two predetermined voltages occurring on a portion of the decay curve that changes relatively slowly. Using predetermined test voltages also avoids the need to set multiple switches and dials and thereby decreases the possibility of human error in using the device.

16 Claims, 3 Drawing Sheets

CHARGE BUILD-UP AND DECAY MONITOR

This invention relates to devices that determine ionization of air by measuring charge build-up and decay on metallic plates surrounded by ionized air.

BACKGROUND OF THE INVENTION

Excessive amounts of static electricity can easily and insidiously destroy or damage integrated circuit (IC) devices. Over-voltages or power densities resulting from static electricity can destroy certain IC junctions and components by, among other things, radically altering the doping structure of the lattices or by impairing the silicon substrate of the IC. As a consequence, industries involved in the fabrication of ICs and other microelectronic components maintain such circuits and components and their environment at or near zero electrical potential during fabrication and packaging. Prevenative measures used in the industry include providing workers and work stations with anti-static carpet, using conductive or dissipative grounded desk top work surfaces, and providing workers with grounding straps such as that described in U.S. Pat. No. 4,577,256. Additionally, effective environmental control requires use of one or more hot air or other ion generators which emit ions to neutralize static charges.

Monitoring the air ion density in an area used for fabricating ICs also is an important factor in limiting or preventing component damage due to excess static charge. Commercially available monitoring devices include charge build-up monitors, which measure directly the static potential present in the area's atmosphere, and charge decay monitors, which measure the time needed for a given charge to be neutralized. Charge decay monitors according to the prior art use a mechanically chopped electrometer head with a vibrating reed to measure voltage on a single charge plate. The mechanical nature of the sampling device results in an increased possibility of system failure and precludes continuous sampling of the voltage on the plate.

Devices of the prior art also typically require that the user set a series of dials or switches in order to determine the starting and stopping voltages for the decay test. If the positions of any of these dials or switches are accidentally altered between tests, the resulting measurements from test to test will not compare. In addition, the large number of dials and swithes increases the likelihood that an incorrect setting on one or more will be used. As a consequence, many ICs may be damaged or destroyed before the mistake could be realized and the generators adjusted to produce sufficient quantities of ions.

One such prior art device, for example, contains a single 6"×6"×¼" metal plate positioned so as to have a 20 pf capacitance between it and electrical ground and uses a mechanically chopped head as mentioned above. A 0–150 second timer also is provided for mesuuring the decay time of the voltage on the plate. This device allows the user to start the test at either 5 kV or 1 kV and stop it at 500 V or 100 V, respectively, or when the plate voltage crosses a manually selected cut-off value. A second devce contains a microprocessor system so that the user may select from any variety of values the start and stop voltages to be used in the decay test. A liquid crystal display (LCD) provides alpha-numeric and graphical output of the results.

SUMMARY OF THE INVENTION

In contrast to the prior art, the charge monitor of the present invention uses two metal plates: a first, electrically isolated "floating plate," and a second "sensing plate" mounted parallel to and at a fixed distance from the floating plate. The sensing plate is connected to monitoring circuitry and may be connected through a capacitor to ground as required. The two plates, of known size and separated by the fixed air gap, form a capacitor of capacitance $C_1$. When the sensing plate is grounded through the capacitor $C_2$ a capacitative voltage divider is formed, allowing the monitoring circuitry to measure voltage continuously without resort to a mechanical contact means such as a vibrating reed.

In time decay mode the floating top plate is charged to a value $V_1$, which may be either positive or negative, in order to determine the presence of both positive and negative ions in the atmosphere being tested. The lower plate is electrically grounded through capacitor $C_2$, which is chosen so that $C_2 >> C_1$. As the charges on the top plate are neutralized by ambient air ions, $V_1$ will decrease as a function of time. The voltage measured across $C_2$, related to $V_1$ by the ration $C_1:C_2$, likewise will decrease with time. Circuitry in the monitor measures the voltage across $C_2$ and subsequently converts the measurement into a positive value, effectively determining the magnitude of the measurement and eliminating the need for separate circuits for processing positive and negative voltages.

Additional circuitry in the device of the present invention compares the measurement magnitude to a predetermined value, typically proportional to 995 V, and commences monitoring the decay time when the magnitude equals the predetermined value. When the magnitude decays to a second predetermined value, selected by the user as typically proportional to 50 V or 25 V, monitoring ceases and the decay time is displayed. Use in this manner allows the user to avoid having to set a large number of dials or switches in order to perform the test and, equally as important, allows the test to be conducted at the same voltages for each repetition. Moreover, by commencing the test at approximately 1 KV rather than at higher values as used in some devices, the present measurements occur on a portion of the decay curve that changes relatively slowly, resulting in less measurement error for a given error in determining the elapsed time.

In charge build-up mode, capacitor $C_2$ is determined from the circuit. However, because the sensing plate is mounted a fixed distance above the grounded metal casing of the monitor, a capacitative voltage divider is formed using the plates and the casing. By measuring the potential difference between the sensing plate and ground the charge present on the floating plate may be determined.

The charge monitor of the present invention also includes dual digital outputs, is handy and portable, and has an increased useful life expectancy.

It is therefore an object of the present invention to provide a charge monitor that avoids use of a mechanical chopper electrometer to provide discrete samples of the charge present on a plate.

It is an additional object of the present invention to provide a charge monitor that can measure the presence of both positive and negative ions without requiring a separate processing circuit for each.

It is a further object of the present invention to provide a charge monitor that operates automatically without the need for the user to set numerous dials and switches before commencing the test.

It is an additional object of the present invention to provide a charge monitor that samples the plate voltage on a portion of the decay curve that varies relatively slowly.

It is a further object of the present invention to provide a charge monitor that measures charge build-up as well as charge decay.

It is yet another object of the present invention to provide a charge monitor that is handy and portable and has an increased useful lifr expectancy over monitors of the prior art.

Other objects, features, and advantages of the present invention will become apparent with reference to the remainder of this document.

DETAILED DESCRIPTION OF THE DRAWINGS

Figure 1A:
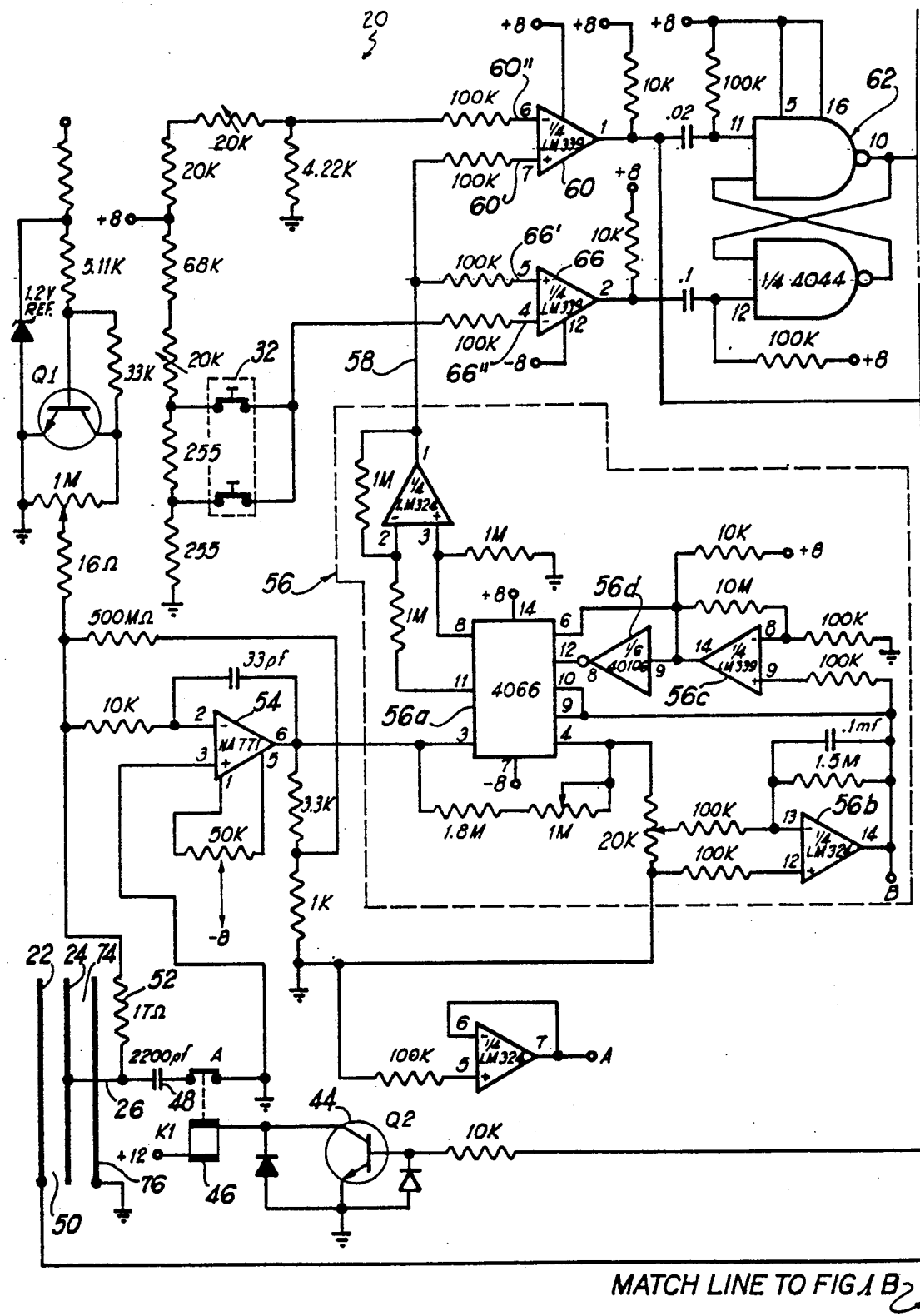
FIGS. 1A-C are schematic representation of the charge monitor of the present invention.
Figure 1B:
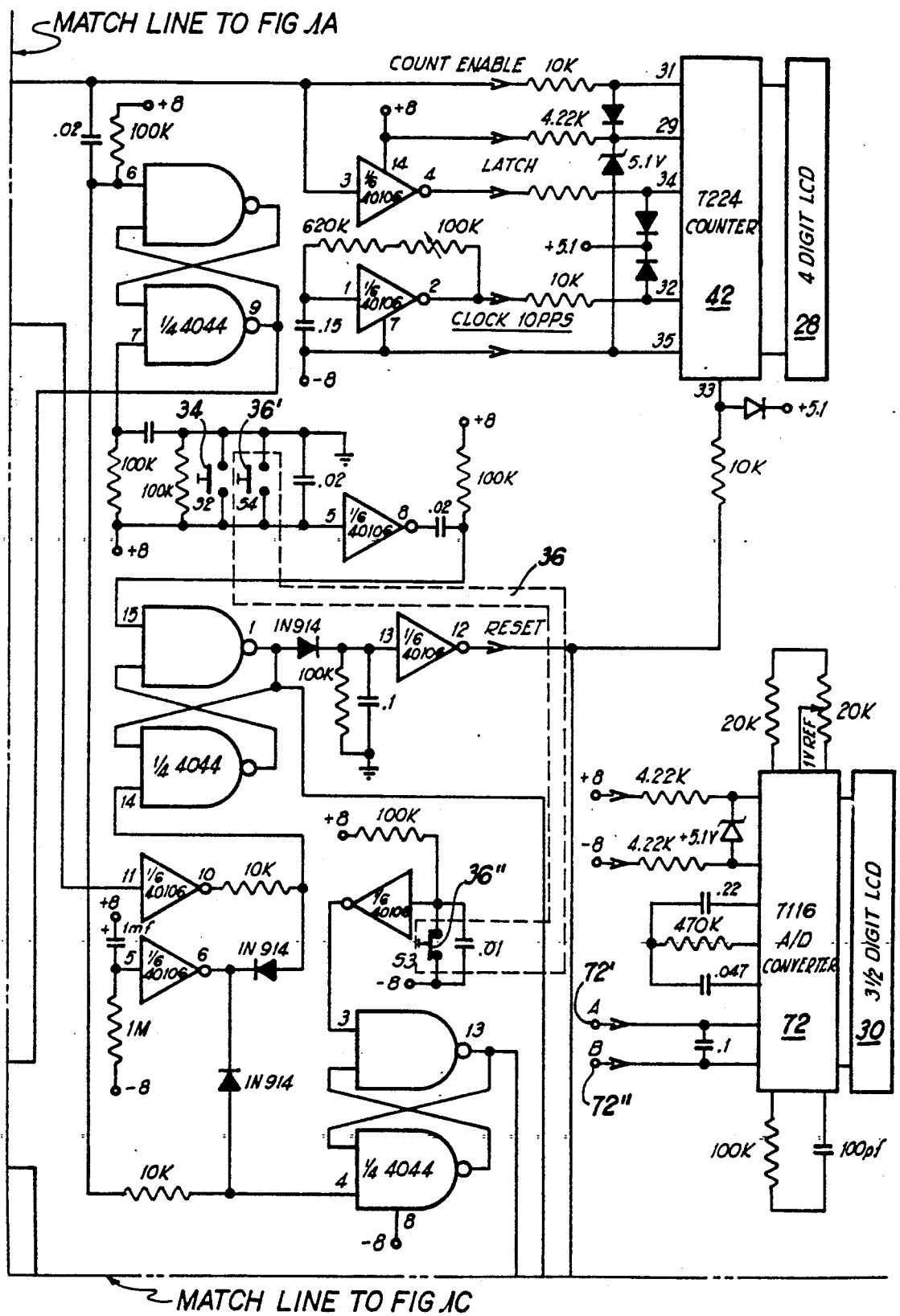
Figure 1C:
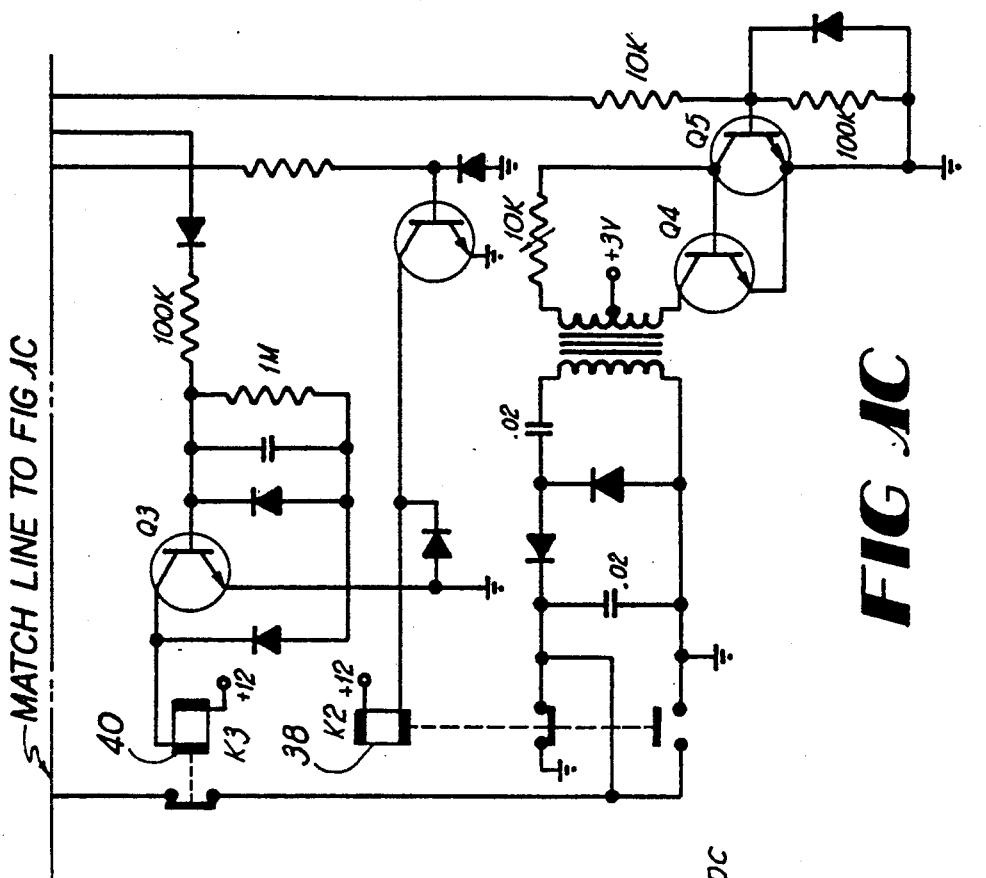

Charge monitor 20 as shown in FIGS. 1A-C includes two conductive plates, a first "floating plate" 22, and a second "sensing plate" 24. Each plate is preferably ssix inches square and made of stainless steel. The floating plate 22 is electrically isolated and the sensing plate 24 is intended to be electrically "invisible" to the floating plate 22. The sensing plate 24 serves as a means for collecting charge and providing an input signal 26 to the processing portion of the circuit.

Figure 2:
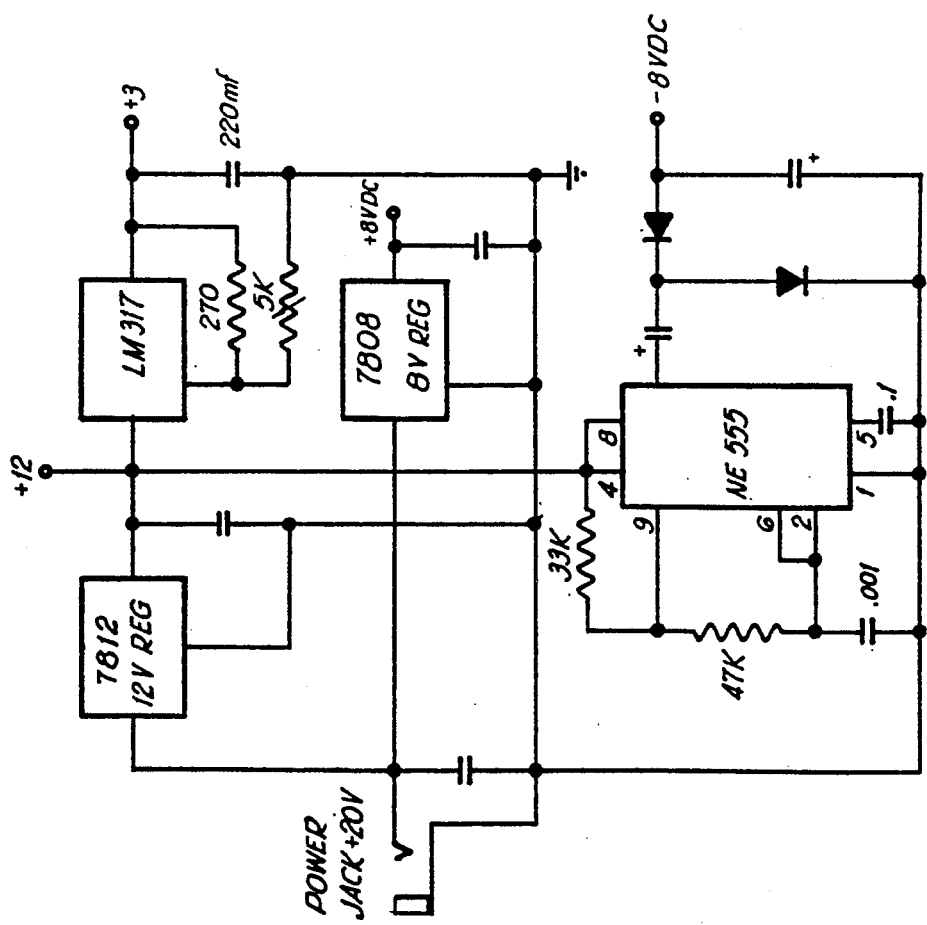
FIG. 2 is a schematic representation of the power supply that accompanies the charge monitor shown in FIGS. 1A-C.

Charge monitor 20 also includes dual digital outputs 28 and 30 for displaying the results of the monitoring tests. Digital output 28, used for displaying elapsed time when monitor 20 is in charge decay measurement mode, may be a four digit liquid crystal display (LCD). Digital output 30, used for displaying the voltage present on plate 22, may be a three and one-half digit LCD, in which the first digit displayed may only be "1." Because most customers prefer a decay test cut-off voltage having a magnitude of either 25 or 50 V, charge monitor 20 contains a switch 32 allowing selection of one or the other of those values. FIG. 2 details a power supply which may be used in conjunction with charge monitor 20 to provide the various voltages needed by its components.

CHARGE DECAY MODE

Charge decay mode may be entered by engaging either of switches 34 or 36. Depressing normally open single pole single throw switch 34 results in a positive charge being placed on plate 22 through polarity selecting and charging relays 38 and 40. Conversely, depressing single pole double throw switch 36 closes the circuit at 36' and opens it at 36" and results in a negative charge being placed on plate 22 through polarity selecting and charging relays 38 and 40. Depressing either of switches 34 or 36 also resets counter 42 that provides the elapsed time count to LCD 28 and, through transistor switch 44 and mode select relay 46, connects a capacitor 48, preferably having a value of 2200 pf but in any case related to the capacitance formed by plates 22 and 24 by a known and predetermined ratio, between the bottom plate 24 and ground.

Conductive plates 22 and 24 are positioned to form an air dielectric capacitor having a capacitance much less than that of capacitor 48. In the preferred embodiment plates 22 and 24 are separated by a predetermined air gap 50 in order to form a capacitor having a capacitance of approximately 20 pf, so that the ratio of the capacitance of plates 22 and 24 to that of capacitor 48 is approximately 0.01. As would be apparent to one skilled in the art, however, because none of these values is critical to the present invention plates of other sizes and materials may be substituted for those of the preferred embodiment, and the separation distance and material may be changed.

The act of charging plate 22 to a voltage $V_1$ (typically greater than 995 V above or below ground) will induce a related voltage $V_2$ on plate 24 which may be measured across capacitor 48 to ground. According to known mathematical principles:

$$\frac{dV_1}{dt} = \frac{C_2}{C_1} \frac{dV_2}{dt}$$

Integrating both sides of the equation with respect to time yields the following relationship between $V_2$ and $V_1$:

$$V_1(t) = \frac{C_2}{C_1} V_2(t)$$

Thus, by measuring the voltage $V_2$ at any given time, the voltage on the top plate 22 may be determined.

Connecting resistor 52 to plate 24 will cause a current (or signal) 26 to flow through the resistor into the monitoring circuitry. Resistor 52 is chosen to have a very large resistance, typically on the order of 1 TΩ, to cause capacitor 48 to discharge much slower than plate 22. Because the potential of a capacitor discharging across a load is given by:

$$V_c(t) = V_0(e \exp(-t/RC))$$

where $V_0$ is the voltage across the capacitor immediately prior to any discharge and R is the load resistance, choosing a large value for R will slow the discharge of capacitor 48 through the load, and thereby effectively make the monitoring circuitry and plate 24 electrically "invisible" to plate 22. Consequently, changes in the value of $V_2$ for a given time interval will be caused almost exclusively by the neutralization of the charge on plate 22 by the ambient air ions, allowing for an accurate determination of the decay time for $V_2$ by the monitoring circuit.

The output of resistor 52 subsequently passes through current amplifier 54 into the absolute value circuitry 56. In the preferred embodiment the parameters of current amplifier 54 are chosen to produce an output current proportional to 0.1 $V_1$/1 TΩ. In addition, in the preferred embodiment absolute value circuit 56 includes commercially available integrated circuits 4066 (56a an analog gate), LM324 (56b, an operational amplifier), LM339 (56c, a comparator), and 40106 (56d, a Schmitt trigger) interconnected as shown in FIG. 1A. The output voltage 58 of circuit 56 always will have a positive value proportional to the magnitude of the voltage present on plate 22. In the preferred embodiment, consequently, the potential difference between output 58 and ground is approximately one-thousandth of the magnitude of the voltage present on plate 22. Thus, for example, if the voltage on plate 22 at time T is ±1000 V, output 58 will be 1 V above ground. Monitoring a voltage proportional to the absolute value of $V_1$ allows a single comparator set to test for both positive and negative ions, preventing the need for virtually duplicative circuitry for each.

Comparator 60 then compares voltage 58 with a predetermined positive voltage and, through flip-flop 62, enables counter 42 when output 58 is no longer greater than the predetermined voltage. In the preferred embodiment the measurements will begin when the voltage on plate 22 is ±995 V. Above approximately 1000 V, the slope of the decay curve is so steep that small time-related errors will result in large errors in voltage measurements. In the example above, where the voltage on plate 22 is ±1000 V and voltage 58 is +1 V at time T, at some time T+ϵ the voltage on plate 22 will decay to ±995 V. At this time voltage 58 will drop to +0.995 V, which value will be applied to the positive input of comparator 60, denoted 60'. Voltage divider circuit 64 produces a constant voltage of 0.995 V input to the negative terminal of comparator 60, labeled 60". At time T+ϵ, when the voltages at 60' and 60" are equal, comparator 60 will produce a signal that changes the state of flip-flop 62, which in turn enables counter 42 to begin measuring elapsed time and displaying that time through LCD 28.

Comparator 66 ends the test when the voltage on plate 22 reaches a second predetermined value, typically ±50 V or ±25 V. In the preferred embodiment switch 32 allows the user to select between cut-off voltages having magnitudes of 50 V or 25 V. Voltage divider 68 produces a constant positive voltage at the negative terminal of comparator 66 (labeled 66") proportional to the cut-off value selected by the user. Voltage 58 is applied to the positive terminal of comparator 66, labeled 66'. At some time T+ϵ, where δ>ϵ, the voltage on plate 22 will decay to the value chosen by the user, causing comparator 66 to alter the state of flip-flop 62 and disable counter 42. Display 28 will show the time needed for the voltage on plate 22 to decay from the first predetermined value to the second and will continue to display the value until the counter 42 is reset as described above. In addition, information concerning the voltage $V_1$ present on plate 22 is fed continuously at points A and B to inputs 72' and 72" of analog-to-digital (A/D) converter 72, where it is converted to a digital value for input to display 30.

CHARGE BUILD-UP MODE

In the preferred embodiment the charge monitor of the present invention defaults into charge build-up mode and remains in that mode until the user depresses either switch 34 or switch 36 as described in the section entitled CHARGE DECAY MODE above. In charge build-up mode neither relay 38 nor relay 40 is activated, so that the only charge present on plate 22 will be due to the presence of ions in the surrounding environment. Moreover, relay 46 remains open, disconnecting capacitor 48 from ground. Consequently, plates 22 and 24 form a capacitive voltage divider with a ratio of 1:1, as plate 24 is positioned so that air gap 74 between plate 24 and the grounded metal casing 76 of the charge monitor 20 creates a 20 pf capacitance between plate 24 and the electrical ground. The voltage $V_2$ on plate 24, which equals $V_1$, generates a signal 26 through resistor 52 which can be processed in a straightforward manner through current amplifier 54 and operational amplifier 70, typically an LM324 integrated circuit, to the inputs 72' and 72" of A/D converter 72. As noted above, A/D converter 72 converts the analog measurement of the voltage present on plate 22 into a digital value which is input to LCD 30 for display.

the foregoing is provided for purposes of illustration, explanation and description of a preferred embodiment of the invention. Modifications and adaptations to this embodiment will be apparent to those of ordinary skill in the art and they may be made without departing from the scope or spirit of the invention.

What is claimed is:

1. A charge monitor comprising:
   a. a first plate for receiving a charge;
   b. a second plate separated from the first plate by a constant predetermined distance;
   c. a capacitor connected to the second plate; and
   d. means connected to the second plate in parallel to the capacitor for indicating the charge on the first plate by sensing the charge induced on the second plate when the capacitor is connected to electrical ground.

2. A charge monitor according to claim 1 in which the indicating means comprises a monitoring circuit having a resistor with a resistance on the order of 1 TΩ for increasing the time needed for the capacitor to discharge.

3. A charge monitor according to claim 2 in which the monitoring circuit further comprises means for indicating the time the charge on the first plate is less than or equal to a first predetermined value and greater than or equal to a second predetermined value.

4. A charge monitor according to claim 1 further comprising means for placing charge on the first plate.

5. A charge monitor according to claim 4 further comprising switching means for connecting the capacitor to electrical ground.

6. A charge monitor comprising:
   a. a first plate for receiving a charge;
   b. a second plate separated from the first plate by a constant predetermined distance;
   c. a capacitor connected to the second plate; and
   d. means connected to the second plate in parallel to the capacitor for monitoring the time needed for the charge on the first plate to vary from one predetermined value to another by sensing the charge induced on the second plate when the capacitor is connected to electrical ground.

7. A charge monitor according to claim 6 further comprising means for placing charge on the first plate.

8. A charge monitor according to claim 6 in which the time monitoring means comprises:
   a. means for generating a first signal proportional to the charge sensed;
   b. means for determining the magnitude of the first signal and generating a second signal proportional thereto;
   c. means for comparing the second signal against third and fourth signals of predetermined magnitude and generating a pulse whose period is proportional to the length of time the value of the second signal is less than the third signal and greater than the fourth signal; and
   d. means for determining the period of the pulse.

9. A charge monitor according to claim 8 in which the third signal bears the same proportion to approximately 995 volts as the first signal bears to the charge sensed.

10. A charge monitor according to claim 8 further comprising means for displaying the period.

11. A charge monitor according to claim 10 further comprising switching means for connecting the capacitor to electrical ground.

12. A charge monitor comprising:
 a. a first plate for receiving a charge;
 b. a second plate separated from the first plate by a first constant predetermined distance and from an electrical ground by a second constant predetermined distance; and
 c. means connected to the second plate and to electrical ground for indicating the charge on the first plate by sensing the charge induced on the second plate.

13. A charge monitor comprising:
 a. a plurality of plates for receiving a time-varying charge;
 b. means for continuously sensing the charge on the plates and generating a first signal proportional thereto;
 c. means for determining the magnitude of the first signal and generating a second signal proportional thereto;
 d. means for comparing the second signal against third and fourth signals of predetermined magnitude and generating a pulse whose period is proportional to the length of time the value of the second signal is less than the third signal and greater than the fourth signal;
 e. means for determining the period of the pulse; and
 f. means for displaying the period.

14. A charge monitor according to claim 13 further comprising means for displaying the first signal.

15. A charge monitor according to claim 14 further comprising means for placing charge on the plates.

16. A charge monitor according to claim 13 in which the plates are separated by a constant predetermined distance.

* * * * *